(12) United States Patent
Kao et al.

(10) Patent No.: US 12,125,782 B2
(45) Date of Patent: Oct. 22, 2024

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Chih-Kuang Kao, Hsin-Chu County (TW); Ta-Chih Peng, Hsinchu (TW); Ming-Hong Kao, Hsinchu (TW); Huei-Wen Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/171,311

(22) Filed: Feb. 17, 2023

(65) Prior Publication Data
US 2023/0207450 A1 Jun. 29, 2023

Related U.S. Application Data

(62) Division of application No. 17/116,926, filed on Dec. 9, 2020, now Pat. No. 11,587,863, which is a division
(Continued)

(51) Int. Cl.
*H01L 23/48* (2006.01)
*H01L 21/02* (2006.01)
(Continued)

(52) U.S. Cl.
CPC .... *H01L 23/5223* (2013.01); *H01L 21/02532* (2013.01); *H01L 21/0254* (2013.01);
(Continued)

(58) Field of Classification Search
CPC ........... H01L 23/5223; H01L 21/02532; H01L 21/0254; H01L 21/02554; H01L 24/17; H01L 25/0657; H01L 28/60; H01L 2224/0401; H01L 2224/05124; H01L 2224/05139; H01L 2224/05144; H01L 2224/05147; H01L 2224/05166; H01L 2224/05181; H01L 2224/05184; H01L 2224/05186; H01L 2224/05558; H01L 2224/05572; H01L 2224/05611;
(Continued)

(56) References Cited

U.S. PATENT DOCUMENTS 8,802,504 B1 8/2014 Hou et al.
8,803,292 B2 8/2014 Chen et al.
(Continued)

*Primary Examiner* — Theresa T Doan
(74) *Attorney, Agent, or Firm* — WPAT Law; Anthony King

(57) ABSTRACT

The present disclosure provides a semiconductor structure, including a capacitor. The capacitor includes a first electrode and a second electrode respectively electrically connected to a first conductor and a second conductor; and a first dielectric layer between the first electrode and the second electrode. In some embodiments, the first dielectric layer contacts with a sidewall surface of the first conductor. The semiconductor structure further includes a second dielectric layer over and adjacent to the capacitor. A method of forming the semiconductor package is also provided.

20 Claims, 19 Drawing Sheets

Related U.S. Application Data of application No. 16/186,096, filed on Nov. 9, 2018, now Pat. No. 10,867,903.

(60) Provisional application No. 62/711,033, filed on Jul. 27, 2018.

(51) Int. Cl.
  H01L 23/00 (2006.01)
  H01L 23/52 (2006.01)
  H01L 23/522 (2006.01)
  H01L 25/065 (2023.01)
  H01L 49/02 (2006.01)

(52) U.S. Cl.
  CPC ........ *H01L 21/02554* (2013.01); *H01L 24/17* (2013.01); *H01L 25/0657* (2013.01); *H01L 28/60* (2013.01)

(58) Field of Classification Search
  CPC ........... H01L 2224/05616; H01L 2224/05647; H01L 2224/13111; H01L 2224/13139; H01L 2224/13147; H01L 24/05; H01L 24/13; H01L 2224/11
  USPC ........................................................ 257/692
  See application file for complete search history.

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2010/0224960 A1* | 9/2010 | Fischer .................. H01L 28/86 257/532 |
| 2011/0210420 A1* | 9/2011 | Lin .................. H01L 23/49822 257/532 |

* cited by examiner

SEMICONDUCTOR STRUCTURE AND METHOD OF FORMING THE SAME

PRIORITY CLAIM AND CROSS-REFERENCE

This patent application is a divisional application of U.S. patent application Ser. No. 17/116,926 filed on Dec. 9, 2020, entitled of "SEMICONDUCTOR STRUCTURE AND METHOD OF FORMING SEMICONDUCTOR PACKAGE", which claims the benefit of U.S. provisional application No. 62/711,033 filed on Jul. 27, 2018 and U.S. patent application Ser. No. 16/186,096 filed on Nov. 9, 2018, the entire contents of all of which are hereby incorporated by reference.

BACKGROUND

As semiconductor technologies further advance, stacked semiconductor devices, e.g., 3D integrated circuits (3DICs), have emerged as an effective alternative to further reduce the physical size of a semiconductor device. In 3D packaging or 3DIC devices, wafers/dies are stacked on top of one another and are interconnected using through connections such as through vias (TVs), I/O pads, bumps, or the like. Structurally, there are dielectric layers covering a peripheral portion of the through connections. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
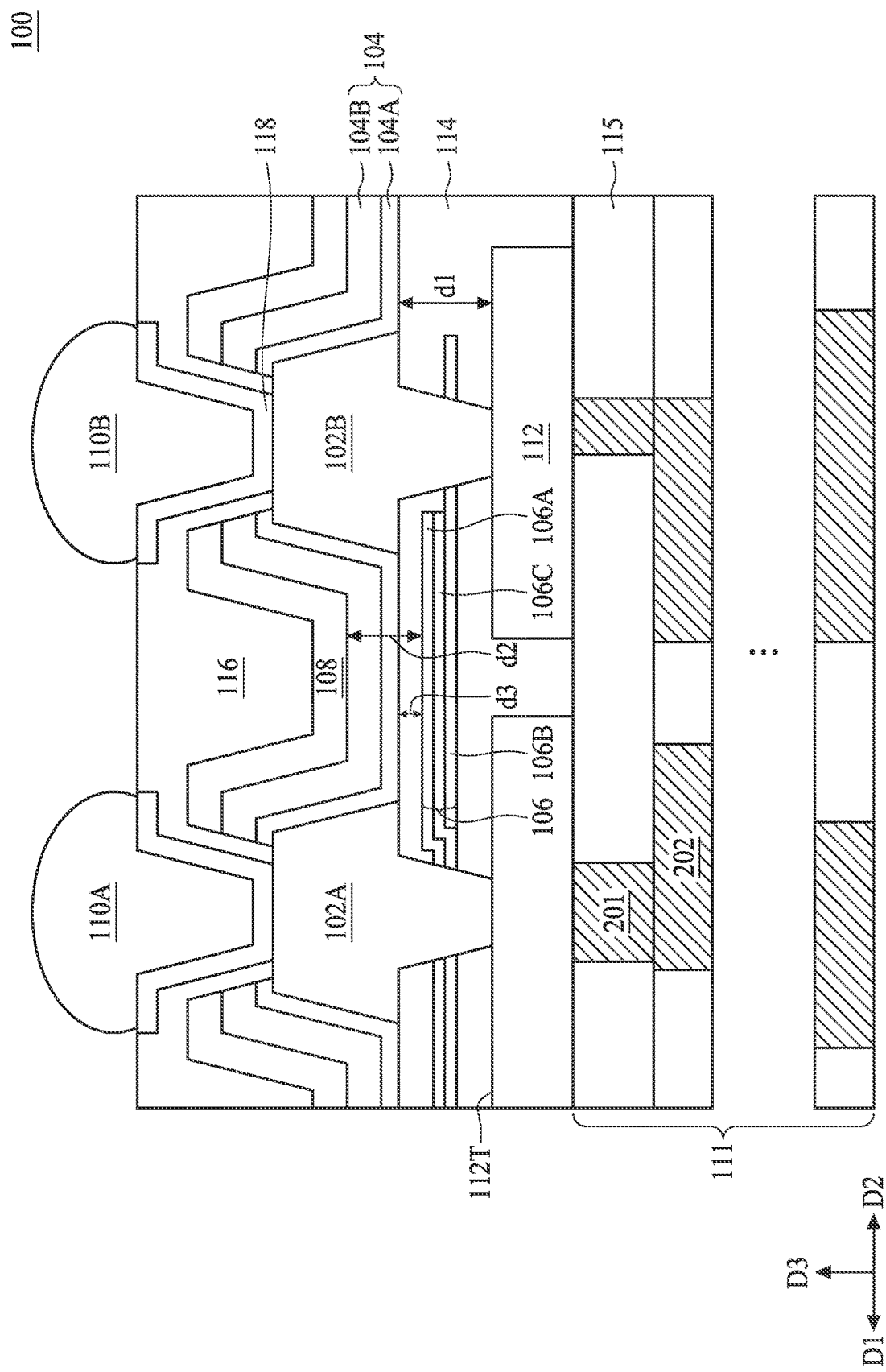
FIG. 1 is a cross section of a semiconductor package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Semiconductor packages and methods of forming the same are provided. In particular, semiconductor packages with embedded metal-isolator-metal (MIM) structure are described in greater detail below. In addition, methods of forming semiconductor packages that are utilizing embedded MIM structure are also provided below. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Before addressing illustrated embodiments specifically, advantageous features and certain aspects of the exemplary embodiments are discussed generally. General aspects of embodiments described herein include a MIM structure designed for detecting passivation cracks, film delamination, bump inducing damages, or other defects appearing in the 3D packaging or 3DIC devices (simply referred as semiconductor package below). The MIM structure may be placed close to locations needed to be tested. As described below in greater detail, the MIM structure may be placed close to a nitride containing dielectric. Another general aspect is that electrical measurements of the MIM structure can be applied during a stacking process of the semiconductor package, such as after each stacking step for stacking multiple workpieces, an electrical measurement of the MIM structure can be performed. In this way, known bad stacks (KBSs) can be identified and re-worked, replaced, flagged or otherwise accounted for during the stacking process. Further processing/stacking of additional workpieces can be limited to only known good stacks (KGSs), thus reducing manufacturing cost and improving overall yield.

Turning now to the illustrated embodiments, FIG. 1 is a cross section of a semiconductor package 100 in accordance with some embodiments of the present disclosure. FIG. 1 illustrates conductors 102A and 102B mounted on an interconnect structure 111.

The interconnect structure 111 may comprise a substrate and various active and passive devices on the substrate, which are not explicitly illustrated in FIG. 1 as their inclusion is not necessary for understanding various embodiments described below. The substrate may be formed of silicon, although it may also be formed of other group III, group IV, and/or group V elements, such as silicon (Si), germanium (Ge), gallium (Ga), arsenic (As), and combinations thereof. The substrate may also be in the form of silicon-on-insulator (SOI). In addition, other substrates that may be used include multi-layered substrates, gradient substrates, hybrid orientation substrates, any combinations thereof and/or the like. In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

The conductors 102A and 102B are respectively configured as an input/output (I/O) terminal of the semiconductor package 100. In some embodiments, the conductors 102A and 102B electrically coupled to the various active and passive devices on the substrate through the interconnect structure 111 and a conductive trace 112.

In some embodiments, the interconnect structure 111 includes a plurality of conductive lines 202 and vias 201 formed in inter-metal dielectrics (IMDs) 115. Though the conductors 102A and 102B are illustrated as contacting with the conductive trace 112 in FIG. 1, this is intended to be illustrative and is not intended to limit the embodiments, as the conductors 102A and 102B may contact with the conductive lines 202 and/or vias 201 in the interconnect structure 111.

In some embodiments, the conductive trace 112 is form on a surface of the IMDs 115 and electrically connects the conductive lines 202 and/or vias 201 in the IMDs 115.

In various examples, the IMDs 115 includes a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like. The low-k dielectric materials may have dielectric constants lower than 3.9. In some embodiments, the dielectric constant of the IMDs 115 is lower than 3.0.

In some embodiments, the conductors 102A and 102B are respectively electrically connected to bumps 110A and 110B at one end and the conductive trace 112 at the other end.

In various examples, the bumps 110A and 110B may be a contact bump, a wire bond, a metal pillar, or the like. Besides, the bumps 110A and 110B may include tin (Sn), silver (Ag), lead-free tin (lead-free Sn), copper (Cu), or compounds thereof. In some embodiments, the bumps 110A and 110B are solder bumps. In some embodiments, the semiconductor package 100 further includes an external device connected to the conductors 102A and 102B through the bumps 110A and 110B.

In some embodiments, the conductors 102A and 102B comprises an upper portion and a lower portion, respectively. In some embodiments, the upper portion may be referred as a redistribution layer (RDL), and the lower portion may be referred as a conductive via.

In some embodiments, a first dielectric 104 partially surrounds the conductors 102A and 102B. The first dielectric 104 is formed to protect and electrically isolate the conductors 102A and 102B and other underlying structures.

In some embodiments, the first dielectric 104 surrounds the upper portion (that is, the RDL portion) of the conductors 102A and 102B. In some embodiments, the first dielectric 104 surrounds upper sidewall surfaces and top surfaces (such as 102S1 and 102T in FIG. 13) of the conductors 102A and 102B. In some embodiments, the first dielectric 104 covers the periphery portions of the conductors 102A and 102B. The central portions (such as 160A and 160B in FIG. 16) of the conductors 102A and 102B are free from coverage of the first dielectric 104. In some embodiments, the central portions of the conductors 102A and 102B form terminals for external electrical connection. In some embodiments, the bumps 110A and 110B join to the central portions of the conductors 102A and 102B.

In some embodiments, the first dielectric 104 is composed of at least two layers, such as a liner oxide 104A and high density plasma (HDP) oxide 104B on the liner oxide 104A. In some embodiments, the liner oxide 104A is conformal. In some embodiments, the liner oxide 104A has a thickness of about 2 kÅ. In some embodiments, the thickness of the HDP oxide 104B is about 2 kÅ to 12 kÅ.

In various examples, the first dielectric 104 includes dielectric materials such as polyimide, benzocyclobutene (BCB), polybenzoxazole (PBO), silicon nitride (SiN), silicon carbide (SiC), silicon oxide (SiO), silicon oxynitride (SiON), low-k dielectrics such as carbon doped oxides, extremely low-k dielectrics such as porous carbon doped silicon dioxide, the like, or a combination thereof. The dielectric constant of the first dielectric 104 is about 4.5~8.5. In some embodiments, the dielectric constant of the first dielectric 104 is about 1.5~2 times higher than the dielectric constant of the IMDs 115.

Still referring to FIG. 1, in some embodiments, the first dielectric 104 is formed on a third dielectric 114. In some embodiments, the first dielectric 104 surrounds the lower portion (that is, the conductive via portion) of the conductors 102A and 102B. In some embodiments, the third dielectric 114 surrounds lower sidewall surfaces (such as 102S2 in FIG. 11) of the conductors 102A and 102B.

In some embodiments, the third dielectric 114 is between the IMDs 115 and the first dielectric 104. In some embodiments, the third dielectric 114 has one side contacting with the IMDs 115 and the other side contacting with the first dielectric 104.

In various examples, the third dielectric 114 includes dielectric materials such as polyimide, benzocyclobutene (BCB), polybenzoxazole (PBO), silicon nitride (SiN), silicon carbide (SiC), silicon oxide (SiO), silicon oxynitride (SiON), low-k dielectrics such as carbon doped oxides, extremely low-k dielectrics such as porous carbon doped silicon dioxide, the like, or a combination thereof.

In some embodiments, the semiconductor package 100 also includes a second dielectric 108 lining along the first dielectric 104. The second dielectric 108 is formed to protect and electrically isolate the conductors 102A and 102B and other underlying structures.

In various examples, the second dielectric 108 includes silicon nitride (SiN), silicon carbide (SiC), silicon oxynitride (SiON), high-k dielectrics or other applicable materials. In some embodiments, the dielectric constant of the second dielectric 108 is about 7.0~9.0. In some embodiments, the dielectric constant of the second dielectric 108 is higher than the other dielectrics in the semiconductor package 100, such as the first dielectric 104, the third dielectric 114, and the IMDs 115.

In some embodiments, the first dielectric 104 is between the second dielectric 108 and the third dielectric 114. In some embodiments, the first dielectric 104 has one side contacting with the second dielectric 108 and another side contacting with the third dielectric 114. In some embodiments, the second dielectric 108 provides a compressive stress to the first dielectric 104. In some embodiments, the third dielectric 114 provides a tensile stress to the first dielectric 104.

In some embodiments, the conductive trace 112 has a top surface 112T receiving the conductors 102A and 102B. In some embodiments, in a third direction D3 (the stacking direction), a distance d1 between the first dielectric 104 and the top surface 112T is smaller than any other distance between the first dielectric 104 and any other metallic layer (such as the conductive lines 202 and vias 201) in the interconnect structure 111.

Still referring to FIG. 1, the semiconductor package 100 also includes a capacitor 106 substantially under the first dielectric 104. The capacitor 106 includes a first electrode 106A and a second electrode 106B. In some embodiments, the first electrode 106A is an upper electrode plate and the second electrode 106B is a lower electrode plate.

As shown in FIG., the first electrode 106A extends along a first direction D1 and electrically connected with the conductor 102A. The second electrode 106B extends along a second direction D2 opposite to the first direction D1 and electrically connected to the conductor 102B. In some embodiments, the first electrode 106A and the second electrode 106B are only electrically connected with one of the conductor 102A and the conductor 102B, respectively.

In some embodiments, the first electrode 106A and the second electrode 106B respectively contacts with the conductors 102A and 102B. In some embodiments, there is a conductive liner (not shown) between the electrodes of the capacitor 106 and the conductors 102A and 102B.

In some embodiments, the capacitor 106 further includes a dielectric layer 106C between the first electrode 106A and the second electrode 106B. The dielectric layer 106C extends along the first direction D1 and contacts with the conductor 102A. In some embodiments, the dielectric layer 106C extends along the first direction D1 and the second direction D2, contacting with both the conductors 102A and 102B.

In some embodiments, the capacitor 106 contacts with the lower sidewall surfaces (such as 102S2 in FIG. 11) of the conductors 102A and 102B. In some embodiments, the conductors 102A and 102B are electrically connected to bumps 110A and 110B at one end and conductive trace 112 at the other end. The capacitor 106 contacts with the bottom sidewall surfaces between the two ends in view of the third direction D3.

In some embodiments, the capacitor 106 is between the conductors 102A and 102B in a top view. In some embodiments, the capacitor 106 is not fully covered by the bumps 110A and 110B in the third direction D3.

In some embodiments, the capacitor 106 is surrounded in the third dielectric 114, which is immediately below the first dielectric 104. In some embodiments, the top surface 112T receiving the conductors 102A and 102B faces the capacitor 106.

In some embodiments, the shortest distance d2 between the second dielectric 108 and the capacitor 106 measured in the third direction D3 is about 3 kÅ to 8 kÅ.

In some embodiments, the shortest distance d3 between the first dielectric 104 and the capacitor 106 measured in the third direction D3 is about 1 kÅ to 3 kÅ.

While the conductors 102A and 102B are illustrated as having similar features, this is intended to be illustrative and is not intended to limit the embodiments, as the conductors 102A and 102B may have similar structures or different structures in order to meet the desired functional capabilities intended for the conductors 102A and 102B.

Additionally, while only two conductors 102A and 102B and its related structure are illustrated in FIG. 1 for simplicity of explanation, this is intended to be illustrative only, and is not intended to be limiting to the embodiments. Rather, Any suitable number of conductors 102A and 102B may alternatively be utilized, and all such combinations are fully intended to be included within the scope of the embodiments. Besides, there may be also any suitable number of capacitors like the capacitor 106 for detecting cracks embedded in the semiconductor package 100.

FIGS. 2-19 are cross sections of the semiconductor package 100 manufactured at various stages in accordance with some embodiments of the present disclosure.

Figure 2:
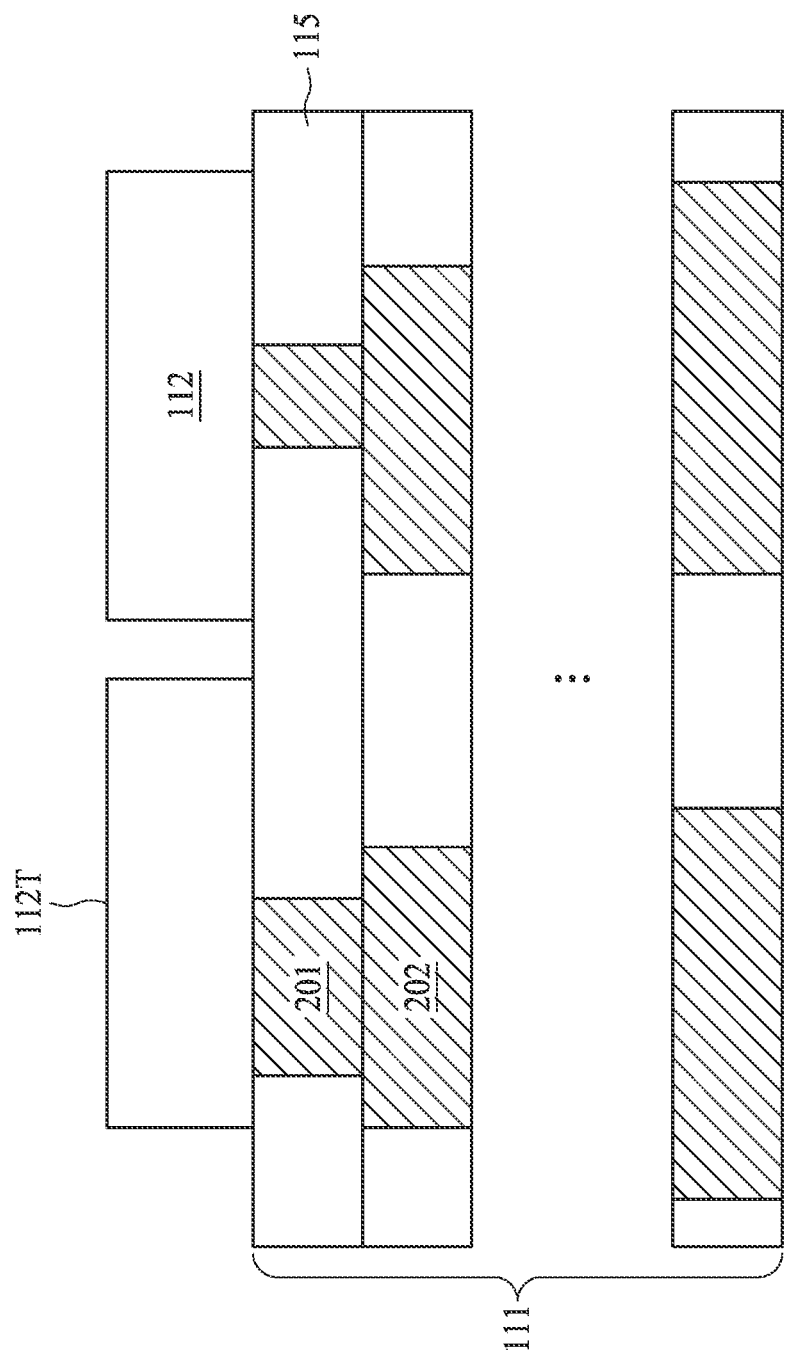
FIGS. 2-19 are cross sections of a semiconductor package manufactured at various stages in accordance with some embodiments of the present disclosure.

Referring to FIG. 2, the interconnect structure 111 is provided. The interconnect structure 111 includes a plurality of vias 201 and conductive lines 202 formed in the IMDs 115, which may be formed of low-k dielectrics with dielectric constants lower than 3.9.

In some embodiments, the IMDs 115 may be formed by any suitable method known in the art, such as spinning, chemical vapor deposition (CVD), and plasma enhanced CVD (PECVD).

In some embodiments, a plurality of vias 201 and conductive lines 202 may be formed in the IMDs 115 using, for example, a damascene process, a dual damascene process, or the like. The IMDs 115 may be patterned using photolithography techniques to form trenches and vias. The vias 201 and conductive lines 202 are formed by depositing a suitable conductive material in the trenches and the vias of the IMDs 115 using various deposition and plating methods, or the like. In addition, the vias 201 and conductive lines 202 may include one or more barrier/adhesion layers (not shown) to protect the IMDs 115 from diffusion and metallic poisoning. The one or more barrier/adhesion layers may comprise titanium (Ti), titanium nitride (TiN), tantalum (Ta), tantalum nitride (TaN), or other alternatives. The barrier layer may be formed using physical vapor deposition (PVD), atomic layer deposition (ALD), sputtering, or the like. The conductive material of vias 201 and conductive lines 202 may comprise copper (Cu), a copper alloy, silver (Ag), gold (Au), tungsten (W), Ta, aluminum (Al), and the like. A polishing and/or grinding process, such as a chemical mechanical polish (CMP) may be performed to remove excess portions of the vias 201 and conductive lines 202. Still referring to FIG. 2, the conductive trace 112 is formed over the interconnect structure 111 and electrically coupled to the vias 201 and/or conductive lines 202.

In some embodiments, the conductive trace 112 comprises Al, although other conductive materials such as Cu, W, Ag, Au, the like, or a combination thereof may also be used. In the illustrated embodiment, the conductive material of conductive trace 112, such as Al, is deposited over the interconnect structure 111 and patterned to form the conductive trace 112 as illustrated in FIG. 2. The conductive trace 112 may be patterned using photolithography techniques.

Generally, photolithography techniques involve depositing a photoresist material, which is subsequently irradiated (exposed) and developed to remove a portion of the photoresist material. The remaining photoresist material protects the underlying material, such as the conductive material of the conductive trace 112, from subsequent processing steps, such as etching. A suitable etching process, such as a reactive ion etch (RIE) or other dry etch, an isotropic or anisotropic wet etch, or any other suitable etch or patterning process may be applied to the conductive material of the conductive trace 112 to remove the exposed portion of the conductive material and form the conductive trace 112. Then the photoresist material may be removed using for example, acetone, n-methylpyrrolidone (NMP), dimethyl sulfoxide (DMSO), aminoethoxy ethanol, and the like. A CMP may be performed to remove excess portions of the conductive trace 112. The top surface 112T of the conductive trace 112 is exposed. The vias 201 and metal lines 202 are omitted in the interest of brevity in the following figures.

Figure 3:
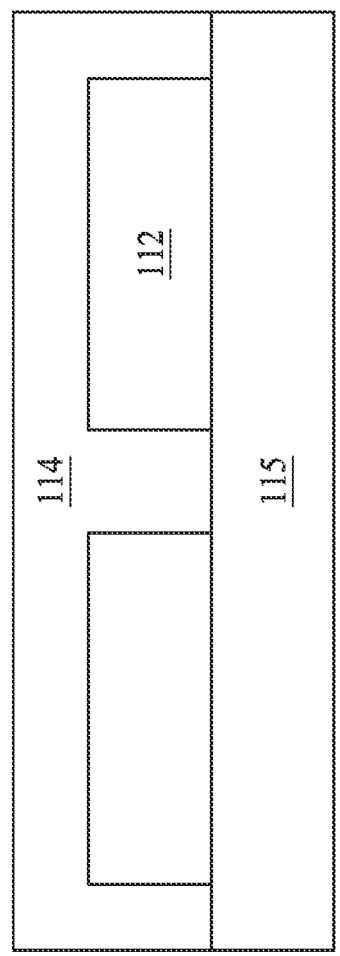

Referring to FIG. 3, the third dielectric 114 is formed on the conductive trace 112 and the IMDs 115. The top surface 112T of the conductive trace 112 is covered by the third dielectric 114. In some embodiments, the third dielectric 114 may comprise dielectric materials described with respect to FIG. 1, and the description is not repeated herein. The third dielectric 114 may be deposited by CVD, PVD, ALD, a spin-on-dielectric process, the like, or a combination thereof.

Figure 4:
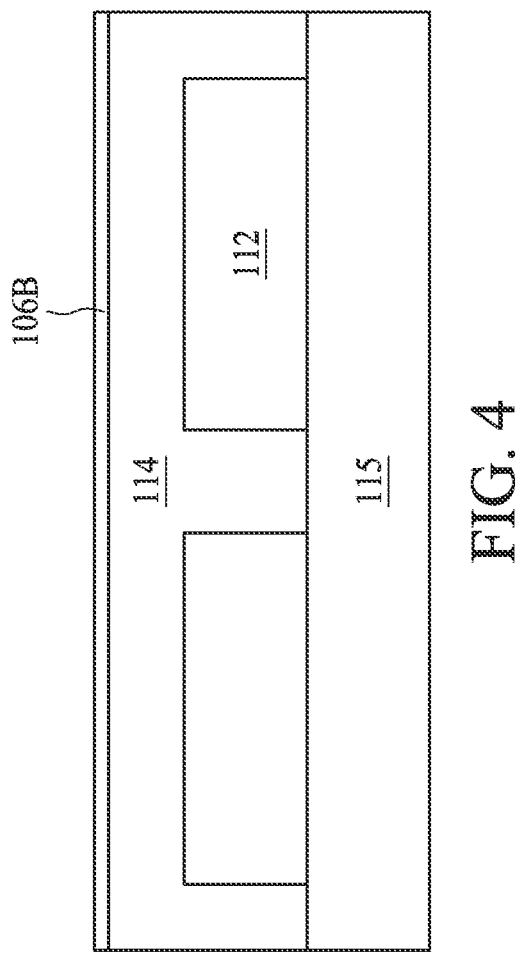

Referring to FIG. 4, the second electrode 106B is formed on the third dielectric 114. The material of the second electrode 106B may include metal such as Cu, Al, W, or other suitable metal or alloy. In some embodiments, the material of the second electrode 106B includes metal compound such as titanium nitride (TiN), tantalum nitride (TaN), or other suitable metal compounds. The second electrode 106B may be single-layered or multi-layered structure. The second electrode 106B may be formed over the third dielectric 114 by CVD, PVD, other suitable operations, or a combination thereof.

Figure 5:
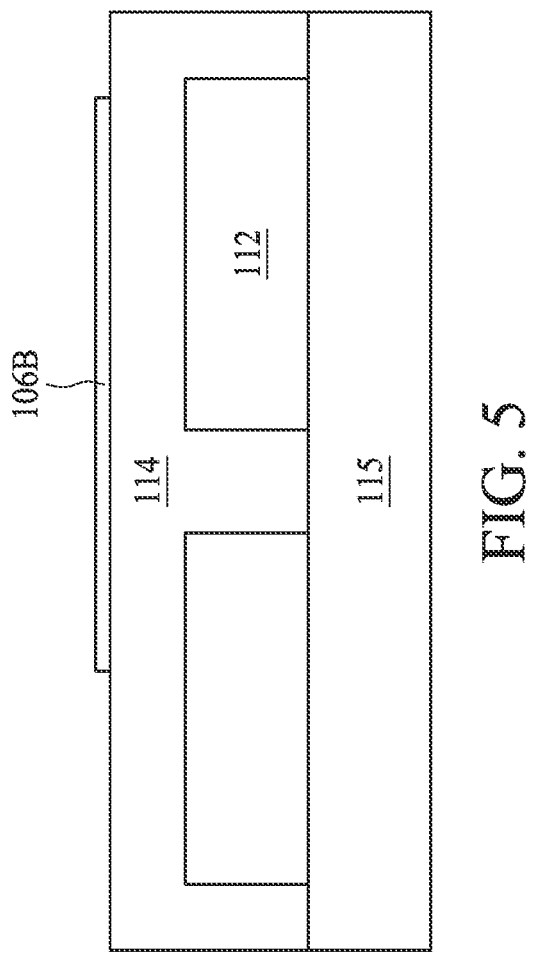

Referring to FIG. 5, the second electrode 106B is patterned. The second electrode 106B may be patterned by photolithography techniques similar to the patterning methods of the conductive trace 112 and the description is not repeated herein.

Figure 6:
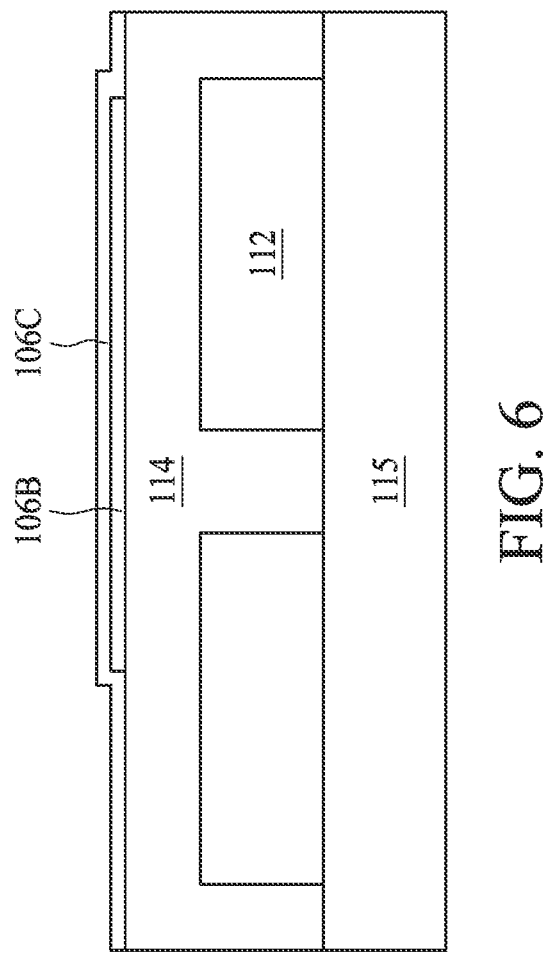

Referring to FIG. 6, the dielectric layer 106C is formed on the second electrode 106B. The material of the dielectric layer 106C may include silicon dioxide ($SiO_2$), silicon nitride ($Si_3N_4$), aluminum oxide ($Al_2O_3$), tantalum oxide ($Ta_2O_5$), titanium oxide ($TiO_2$), zirconium oxide ($ZrO_2$), hafnium oxide ($HfO_2$), lanthanum oxide ($La_2O_3$), strontium titanate ($SrTiO_3$) or any other suitable low-k or high-k dielectric materials. The dielectric layer 106C may be formed over the second electrode 106B by ALD, CVD, other suitable operations, or a combination thereof.

Figure 7:
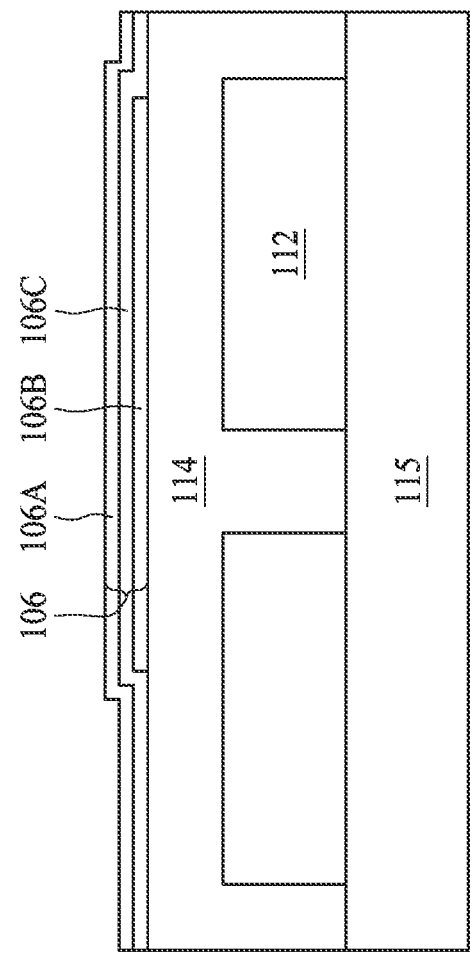
Figure 8:
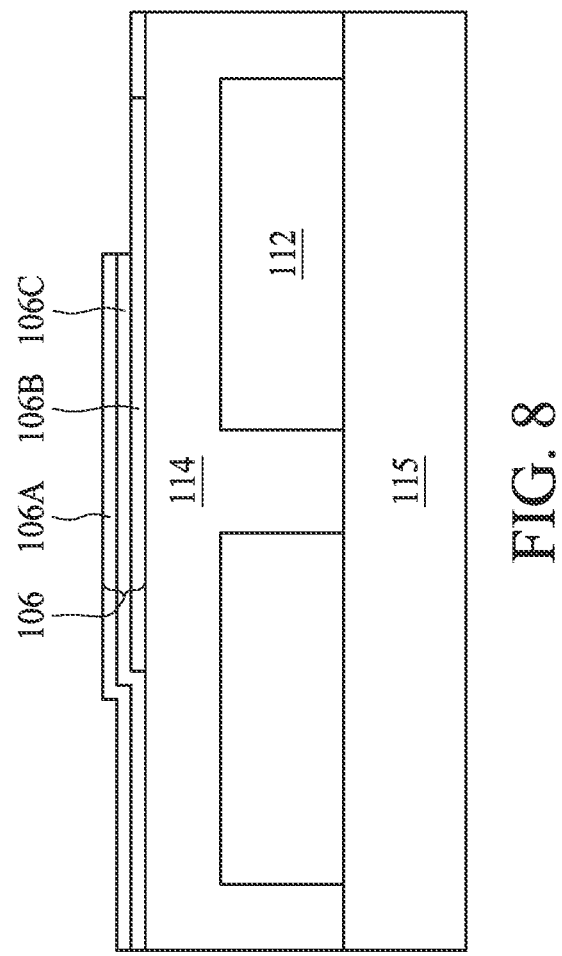

Referring to FIGS. 7 and 8, the first electrode 106A is formed on the dielectric layer 106C and patterned. The formation of the first electrode 106A may refer to the formation of the second electrode 106B in FIGS. 4 and 5. The first electrode 106A, the dielectric layer 106C and the second electrode 106B constitute the capacitor 106.

Figure 9:
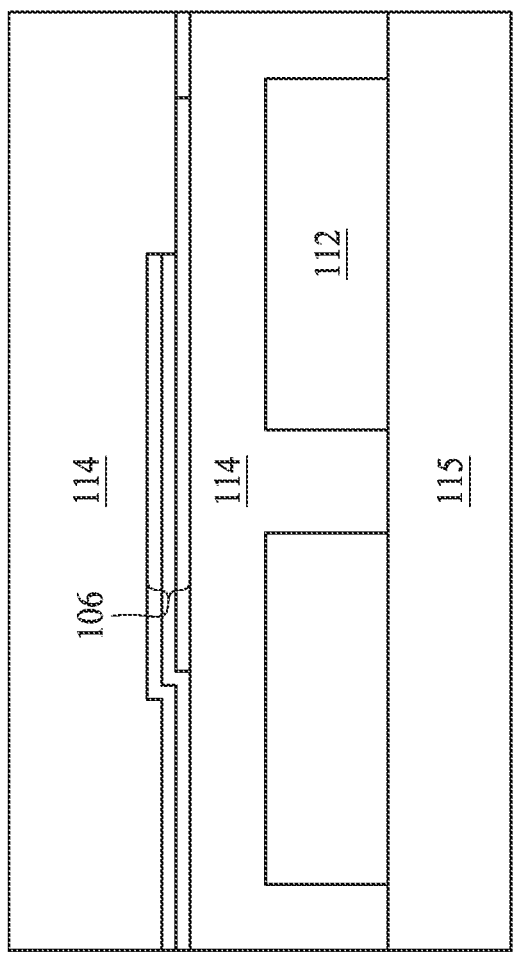

Referring to FIG. 9, the third dielectric 114 is formed on the capacitor 106. The capacitor 106 is surrounded by the third dielectric 114. The formation of the third dielectric 114 may refer to FIG. 3.

Figure 10:
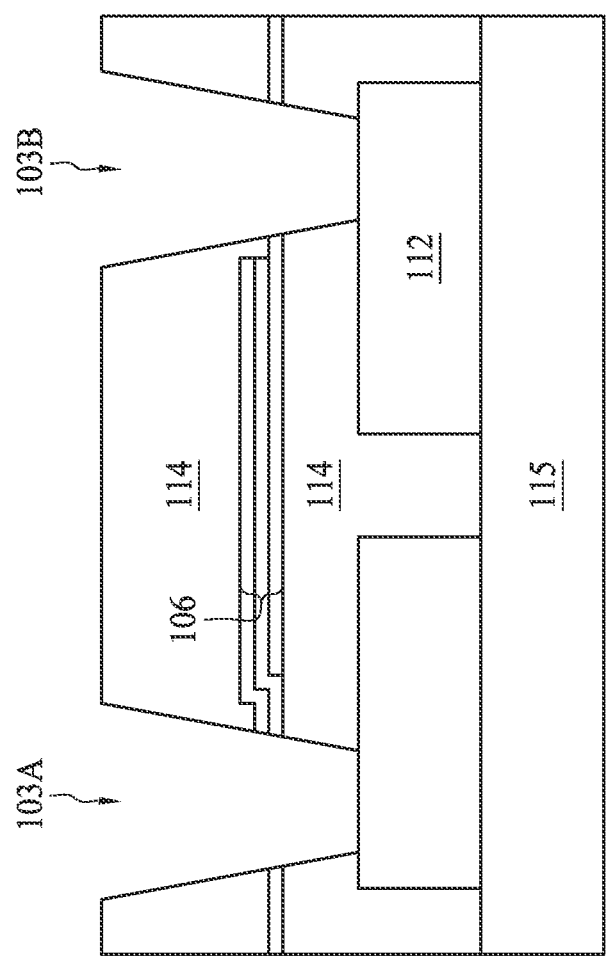

Referring to FIG. 10, FIG. 10 illustrates the formation of the openings 103A and 103B in the third dielectric 114. The openings 103A and 103B penetrate through portions of the capacitor 106. The openings 103A and 103B may be made through the third dielectric 114 by removing portions of the third dielectric 114 to expose at least a portion of the underlying conductive trace 112. The openings 103A and 103B allows for contact between the conductive trace 112 and the subsequently formed conductor 102.

In some embodiments, a photoresist material (not shown) is formed over the third dielectric 114. The photoresist material is subsequently irradiated (exposed) and developed to remove a portion of the photoresist material. Subsequently, exposed portions of the third dielectric 114 are removed using, for example, a suitable etching process to form the openings 103A and 103B.

Figure 11:
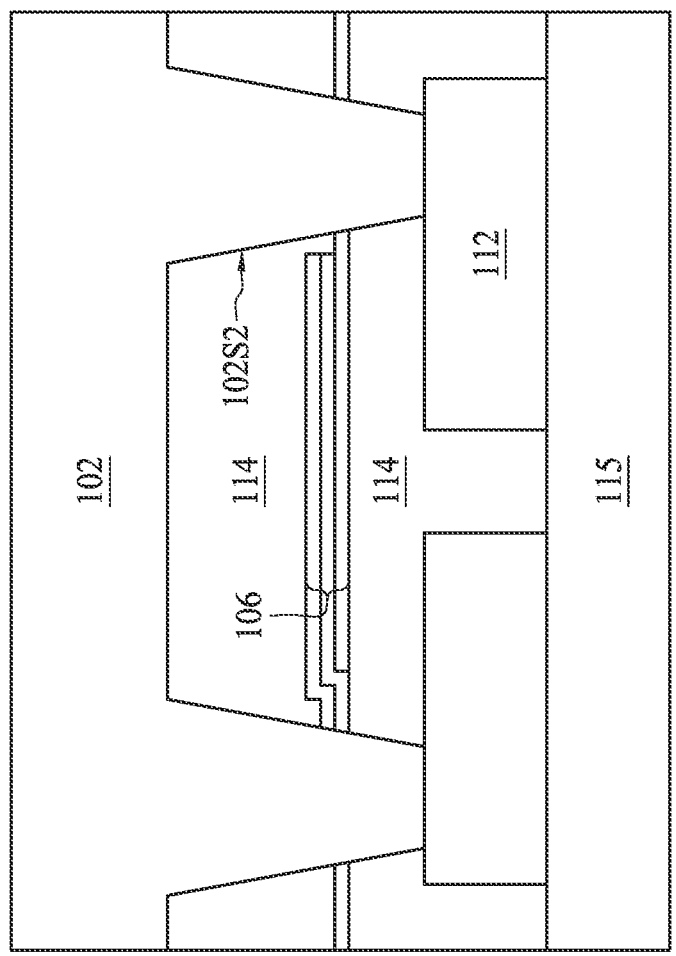

Referring to FIG. 11, openings 103A and 103B are filled with a conductive material to form the conductors 102A and 102B. The conductive material may comprise Cu, W, Al, Ag, Au, the like, or a combination thereof, and may be formed using an electro-chemical plating process, an electroless plating process, PVD, ALD, the like, or a combination thereof.

In some embodiments, a seed layer (not shown) may be formed on the exposed conductive trace 112. In some embodiments, the seed layer may comprise a conductive material such as Ti, TiN, Ta, TaN, or other alternative, and may be formed using PVD, ALD, the like, or a combination thereof.

In some embodiments, a conductive liner (not shown) may be formed in the openings 103A and 103B. The material of the conductive liner includes TiN, TaN, tungsten nitride ($WN_x$), or other suitable materials. The conductive liner may be formed along the third dielectric 114 and in the openings 103A and 103B by CVD, PVD, PECVD, ALD, other suitable operations, or a combination thereof.

The third dielectric 114 and the capacitor 106 contact with the lower sidewall surfaces 102S2 of the conductor 102. The conductive trace 112 contacts with the conductor 102 at the bottom of the openings 103A and 103B.

Figure 12:
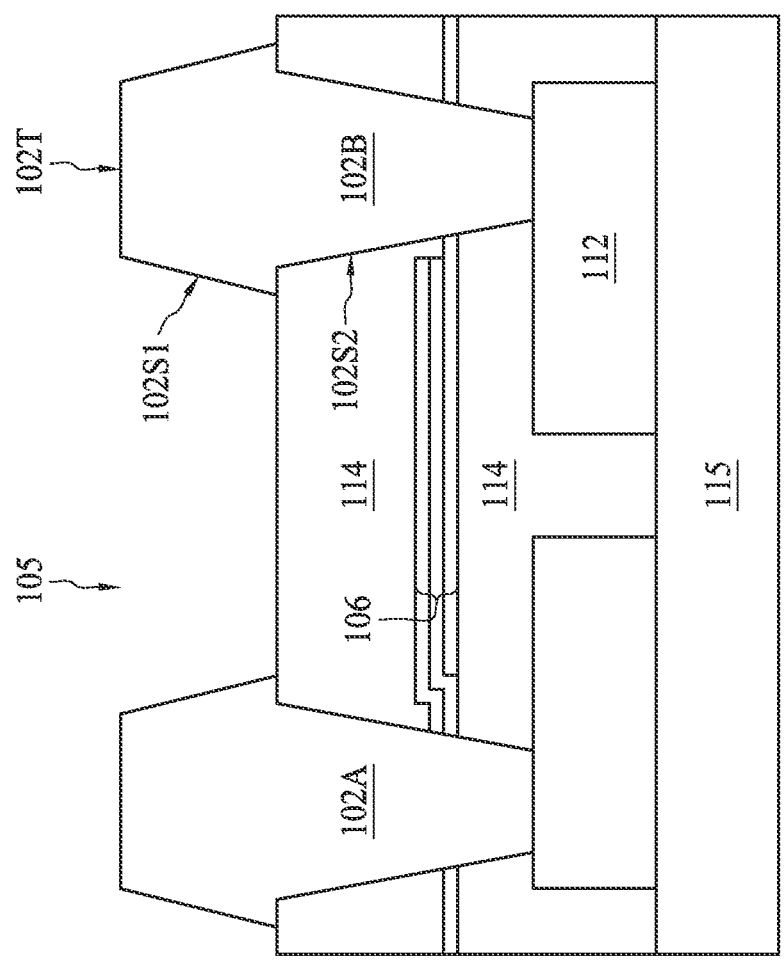

Referring to FIG. 12, FIG. 12 illustrates the formation of the recess 105 in the conductor 102. The recess 105 may be formed by first depositing a photoresist (not shown) on the conductor 102. The photoresist may then be patterned to cover portions of the conductor 102 where the conductors 102A and 102B are desired to be located. Once the photoresist has been formed and patterned, portions of the conductor 102 not covered by the photoresist can be removed by a suitable etching process. Additionally, after the removal of the photoresist, excess conductive materials of the conductors 102A and 102B can be removed through a CHIP or the like. The conductor 102A and 102B may have a thickness less than about 30 kÅ, for example between about 2 kÅ and about 25 kÅ.

After the formation of the recess 105, the conductor 102A and 102B with the upper sidewall surfaces 102S1 and top surfaces 102T of are formed.

Figure 13:
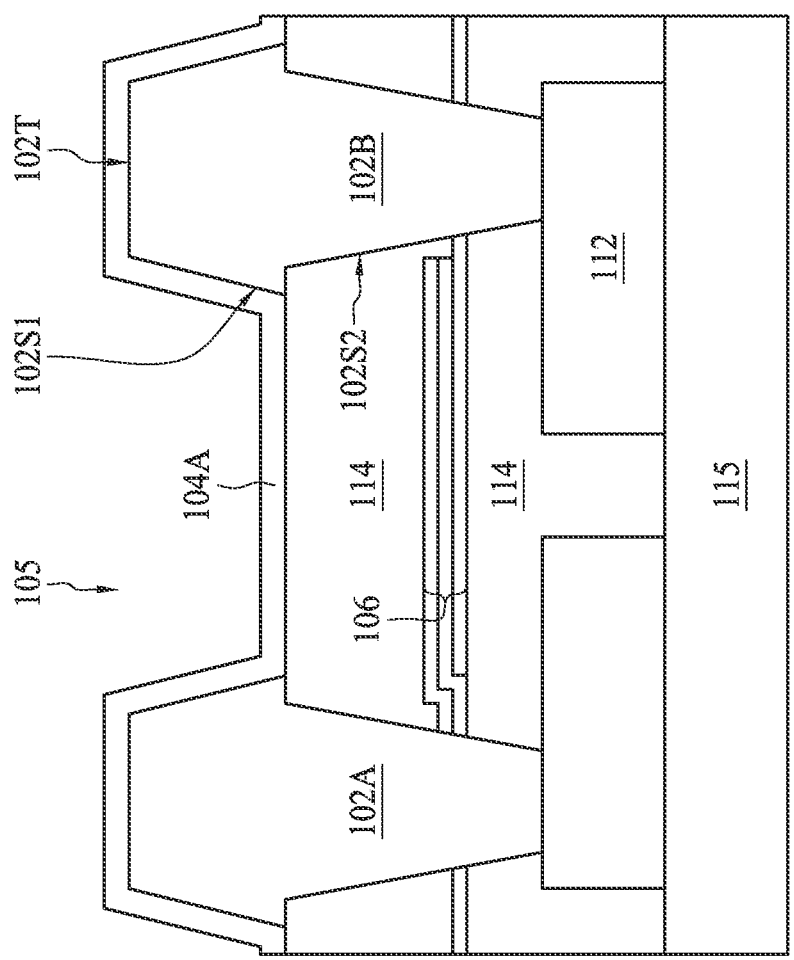

Referring to FIG. 13, the liner oxide 104A is formed over the conductors 102A and 102B and lining along surface contours of the conductors 102A and 102B. The liner oxide 104A contacts with the upper sidewall surfaces 102S1 and top surfaces 102T of the conductor 102A and 102B.

The liner oxide 104A may be formed of $SiO_2$ or other suitable materials. The liner oxide 104A may be formed on the conductor 102A and 102B as a conformal insulator layer and grown to a thickness of about 2 kÅ.

Figure 14:
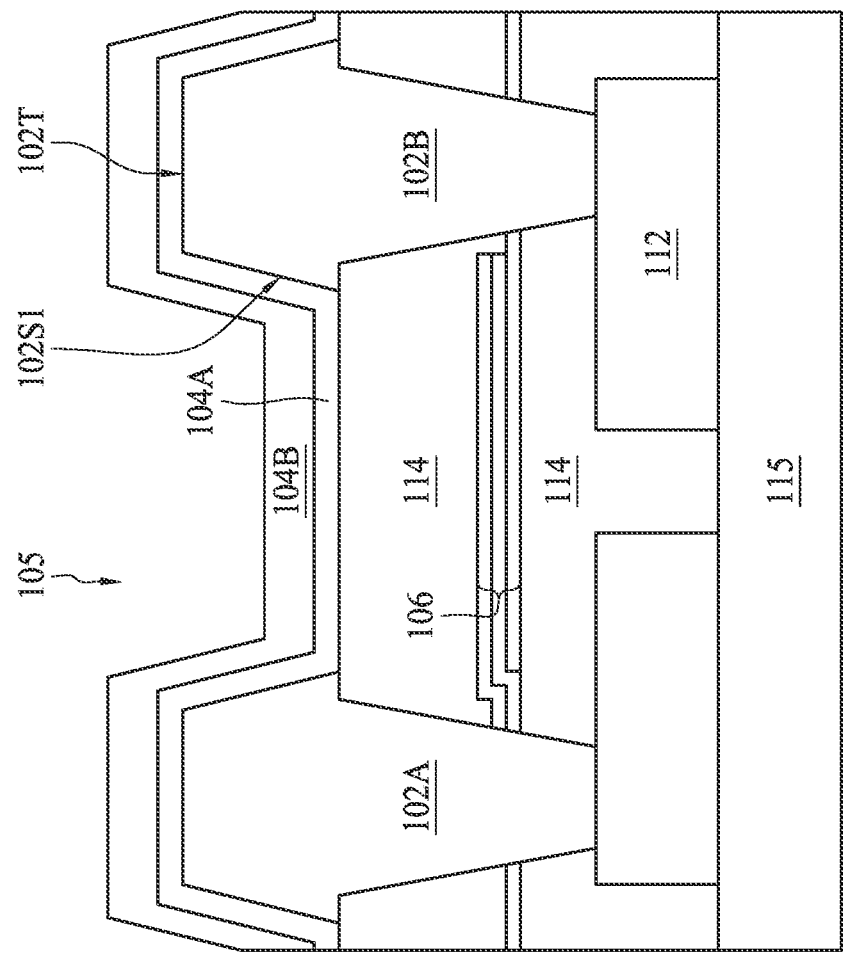

Referring to FIG. 14, The HDP oxide 104B is formed over the liner oxide 104A and lining along a surface contour of the liner oxide 104A. The HDP oxide 104B is usually deposited in the recess 105 between the conductors 102A and 102B by a high density plasma process. Therefore, the thickness of the HDP oxide 104B on the sidewalls of the recess 105 is less than the thickness on the bottom of the recess 105. In some embodiments, the thickness of the HDP oxide 104B on the bottom of the recess 105 is about 9 kÅ.

The HDP oxide 104B may be formed of USG, $SiO_X$, or other suitable materials. The HDP oxide 104B may be deposited using LPCVD or PECVD. The liner oxide 104A and the HDP oxide 104B are also referred as the first dielectric 104.

Figure 15:
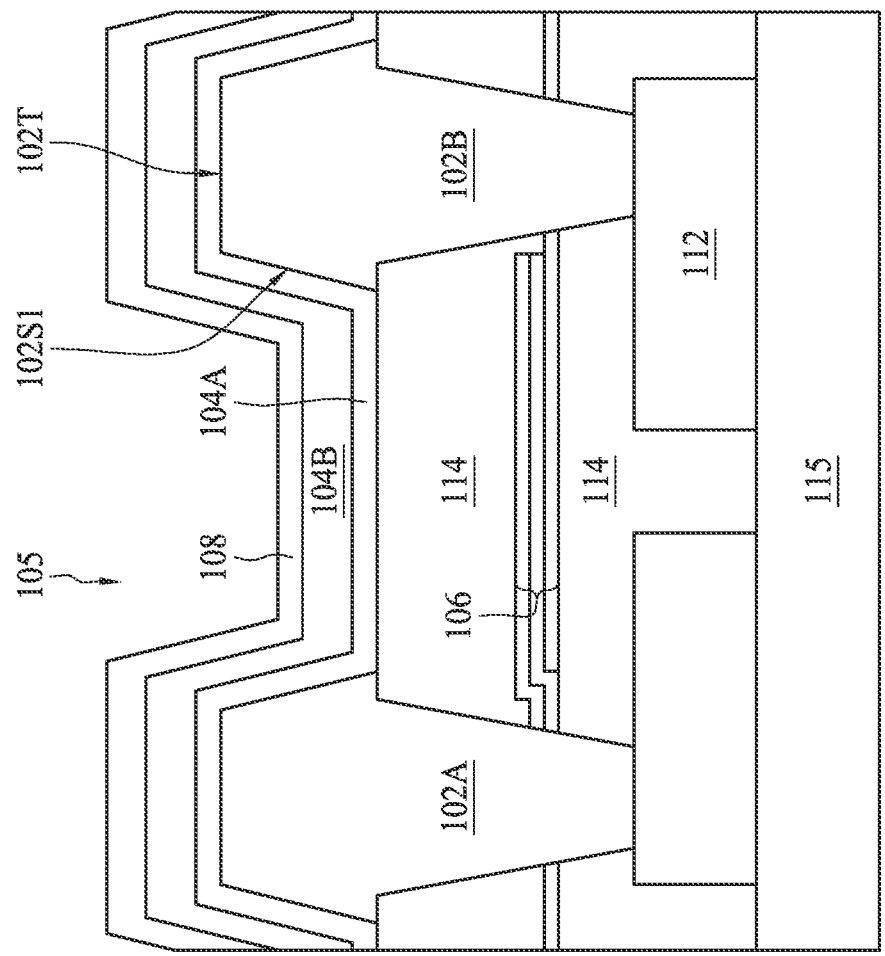

Referring to FIG. 15, the second dielectric 108 is formed over the conductors 102A and 102B and lining along the upper sidewall surfaces 102S1 and top surfaces 102T of the conductors 102A and 102B.

In some embodiments, the second dielectric 108 may be composed of SiN, SiC, SiON, high-k dielectrics or other applicable materials. The second dielectric 108 may be deposited by CVD, PVD, PECVD, ALD, other suitable operations, or a combination thereof.

Figure 16:
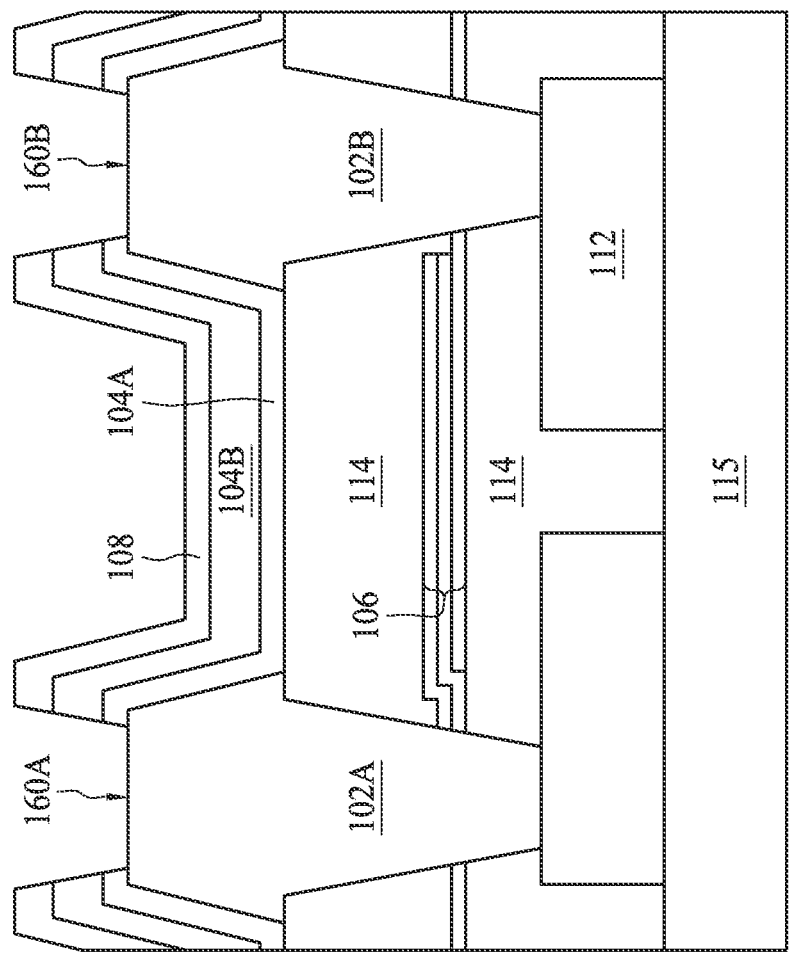

Referring to FIG. 16, the central portions 160A and 160B of the conductors 102A and 102B are exposed. The central portions 160A and 160B may be exposed using a suitable photolithographic mask and etching process, although any suitable process to expose portions of the conductors 102A and 102B may be used.

In some embodiments, a photoresist material (not shown) is formed over the second dielectric 108 and the first dielectric 104. The photoresist material is subsequently irradiated (exposed) and developed to remove a portion of the photoresist material. Subsequently, exposed portions of the second dielectric 108 and the first dielectric 104 are removed using, for example, a suitable etching process to form the openings. In an embodiment with the layer formed of silicon oxide, the layer is etched using, for example, buffered hydrofluoric acid (HF). In another embodiment with the layer formed of silicon nitride, the layer is etched using, for example, hot phosphoric acid ($H_3PO_4$).

Figure 17:
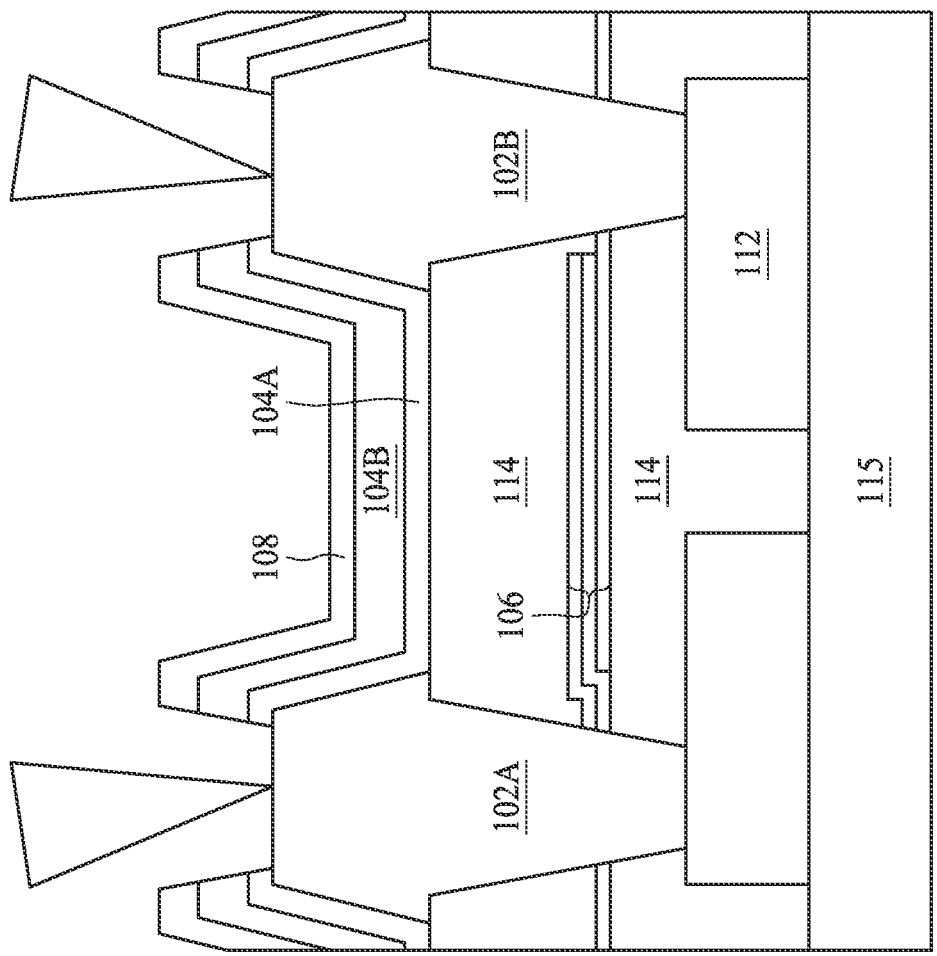

Referring to FIG. 17, after the central portions 160A and 160B are explored, an electrical measurement of the capacitor 106 can be taken to detect whether there is a crack propagating to the capacitor 106 and affecting the electrical properties of the capacitor 106. If it is found out that the capacitance of the capacitor 106 deviates from a standard range, the capacitor 106 should have been destroyed. Therefore, it can be assumed that passivation cracks, film delamination, bump inducing damages, or other defects may have occurred. For example, the capacitance of the capacitor 106 may decrease if the capacitor 106 has cracked.

Figure 18:
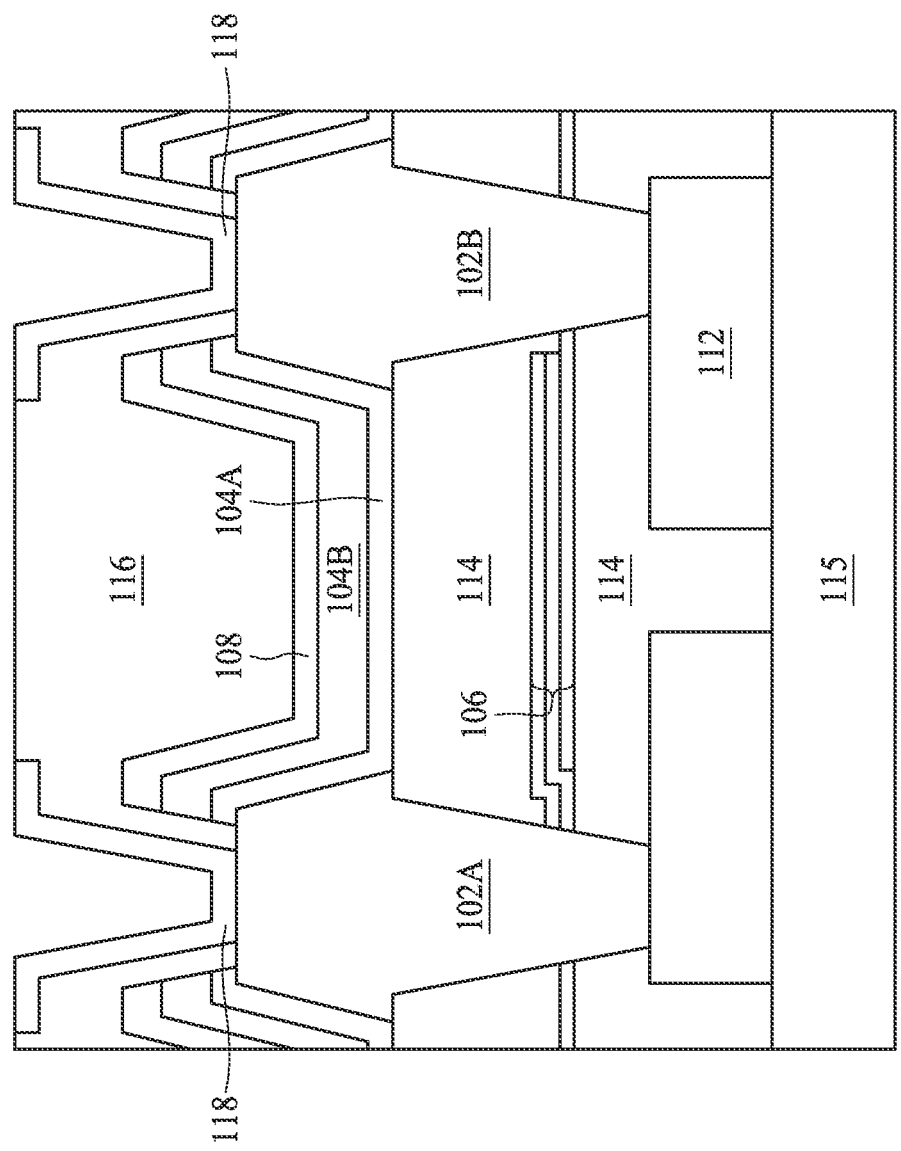

Referring to FIG. 18, a polymer layer 116 and an under bump layer (UBM) layer 118 are formed to further receive the bumps 110A and 110B on the semiconductor package 100.

In some embodiments, the polymer layer 116 may comprise a dielectric material such as polyimide, benzocyclobutene (BCB), polybenzoxazole (PBO), the like, or a combination thereof, and may be formed using a spin-on coating process, or the like.

In some embodiments, the UBM layer 118 may include multiple layers such as a diffusion barrier layer and a seed layer over the diffusion barrier layer. In some embodiments, the diffusion barrier layer may also function as an adhesion layer. In some embodiments, the diffusion barrier layer may be formed of Ta, Ti, or compounds thereof, such as TaN. In some embodiments, the seed layer may be formed of tin (Sn), lead (Pb), Cu, or other metal or metal alloy for further manufacturing the bumps 110A and 110B on the conductors 102A and 102B.

In some embodiments, the UBM layer 213 may be deposited by PVD, by sputtering, or by other suitable operations, or a combination thereof. Then the UBM layer 213 may be patterned by depositing a mask layer and removing portions not covered by the mask layer through a suitable etching process.

Figure 19:
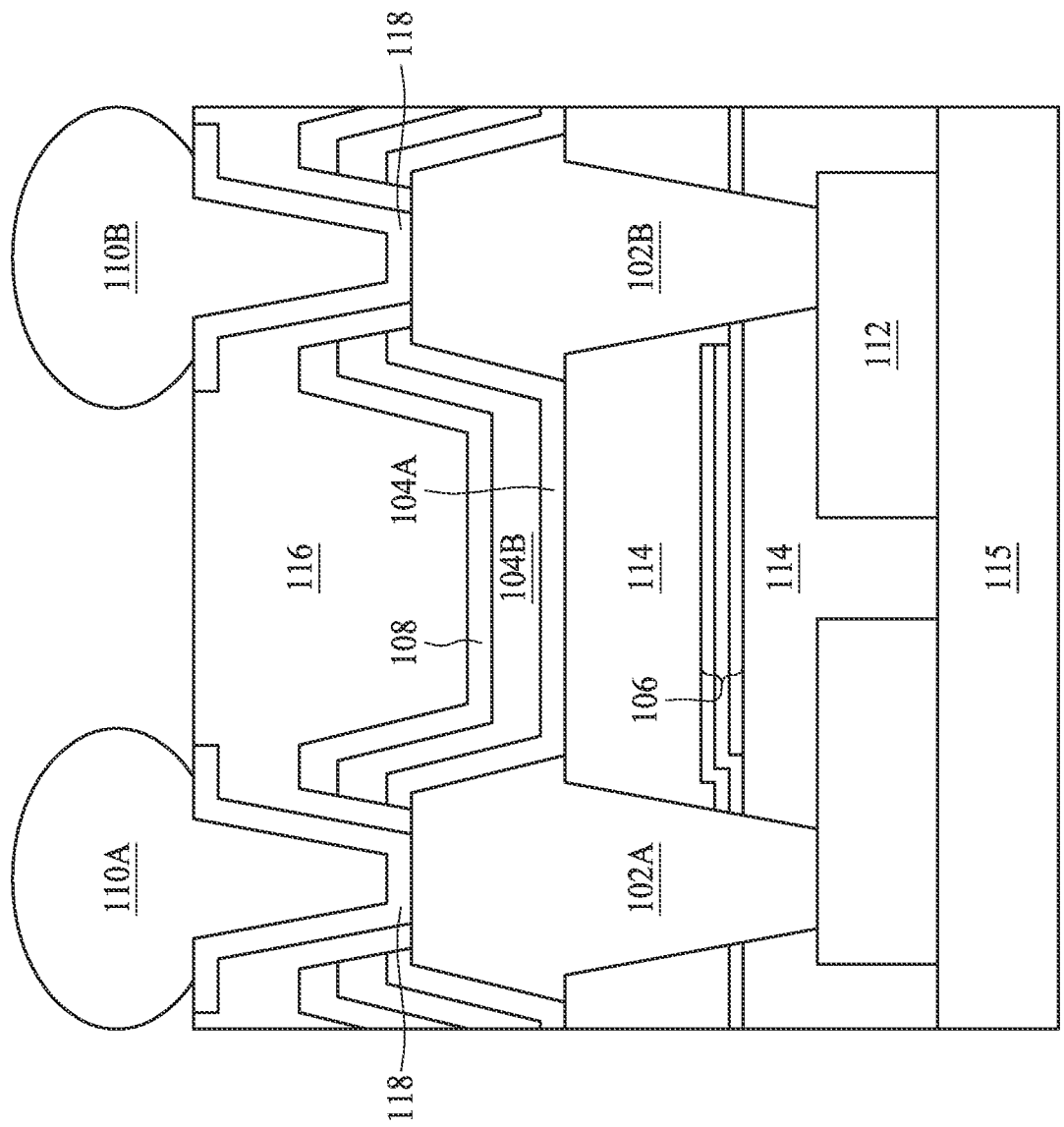

Referring to FIG. 19, the bumps 110A and 110B are placed over the UBM layer 213. Heating-cooling cycles are performed for placing the bumps 110A and 110B.

Subsequent operations may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

Some embodiments of the present disclosure provide a semiconductor structure, including a capacitor. The capacitor includes a first electrode and a second electrode respectively electrically connected to a first conductor and a second conductor; and a first dielectric layer between the first electrode and the second electrode. In some embodiments, the first dielectric layer contacts with a sidewall surface of the first conductor. The semiconductor structure further includes a second dielectric layer over and adjacent to the capacitor.

Some embodiments of the present disclosure provide a semiconductor structure including a first conductor, a second conductor, a capacitor, an oxide containing dielectric and a nitride containing dielectric. The capacitor is disposed between the first conductor and the second conductor, and electrically connected to the first conductor and the second conductor. The oxide containing dielectric is disposed over the capacitor and surrounding the first conductor and the second conductor. The nitride containing dielectric is disposed over the oxide containing dielectric. In some embodiments, a portion of the first conductor and a portion of the second conductor are exposed from the oxide containing dielectric and the nitride containing dielectric.

Some embodiments of the present disclosure provide a method for manufacturing a semiconductor package. The method includes providing an interconnect structure with a conductive trace; forming a capacitor over the interconnect structure; and forming at least two conductors penetrating through a portion of the capacitor and electrically connected with the capacitor and the conductive trace.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, comprising:
   providing an interconnect structure with a conductive trace;
   forming a capacitor over the interconnect structure;
   forming a first dielectric surrounding the capacitor;
   forming a first conductor and a second conductor penetrating through the first dielectric and a portion of the capacitor and electrically connected with the capacitor and the conductive trace; and
   performing an electrical measurement of the capacitor through the first conductor and the second conductor.

2. The method of claim 1, wherein the formation of the capacitor comprises:
   forming a first electrode extending along a first direction and electrically connected with the first conductor;
   forming a second electrode extending along a second direction opposite to the first direction and electrically connected to the second conductor.

3. The method of claim 2, wherein a sidewall surface of the first electrode contacts the first conductor, and a sidewall surface of the second electrode contacts the second conductor.

4. The method of claim 2, wherein the first electrode is isolated from the second conductor, the second electrode is isolated from the first conductor.

5. The method of claim 1, further comprising:
   forming a second dielectric covering the first dielectric, the first conductor and the second conductor;
   removing portions of the second dielectric to at least partially expose the first conductor and the second conductor,
   wherein the first conductor and the second conductor are partially exposed through the second dielectric during the electrical measurement of the capacitor.

6. The method of claim 1, further comprising:
   forming a third dielectric over the second dielectric and the capacitor.

7. The method of claim 6, wherein a dielectric constant of the third dielectric is substantially greater than a dielectric constant of the second dielectric, or the dielectric constant of the third dielectric is substantially greater than a dielectric constant of the first dielectric.

8. The method of claim 6, wherein a shortest distance between the third dielectric and the capacitor is about 1 kÅ to 3 kÅ.

9. The method of claim 6, wherein the second dielectric contacts the third dielectric.

10. The method of claim 1, further comprising:
    placing a solder bump over the first conductor or the second conductor to electrically connect to the conductive trace.

11. The method of claim 1, wherein the first dielectric and the second dielectric contain oxide, and the third dielectric contains nitride.

12. A method of forming a semiconductor structure, comprising:
    providing an interconnect structure;
    disposing a first dielectric over the interconnect structure;
    forming a capacitor over the first dielectric, wherein the formation of the capacitor includes:
      forming a first electrode over the interconnect structure;
      forming a first dielectric layer over the first electrode;
      forming a second electrode over the first dielectric layer;
    forming a second dielectric over the capacitor and the first dielectric;
    forming a first conductor penetrating through the first electrode, the first dielectric and the second dielectric;
    forming a second conductor penetrating through the first dielectric layer and the second electrode; and
    measuring a capacitance of the capacitor through the first conductor and the second conductor.

13. The method of claim 12, wherein the first electrode contacts the first conductor, and the second electrode contacts the second conductor.

14. The method of claim 12, wherein the first dielectric layer contacts the second conductor.

15. The method of claim 12, wherein the first electrode is partially covered by the first dielectric layer and is partially in contact with the second dielectric.

16. The method of claim 12, prior to the formation of the first conductor and the formation of the second conductor, further comprising:
    forming a first opening through the first dielectric, the first electrode and the second dielectric;
    forming a second opening through the first dielectric, the second electrode, the first dielectric layer and the second dielectric.

17. The method of claim 16, wherein the first conductor is disposed within the first opening, and the second conductor is disposed within the second opening.

18. A method of forming a semiconductor structure, comprising:
    providing an interconnect structure;
    forming a capacitor over the interconnect structure;
    forming a dielectric surrounding the capacitor;
    forming a first conductor and a second conductor penetrating through the dielectric and a portion of the capacitor and electrically connected with the capacitor;
    performing an electrical measurement of the capacitor through the first conductor and the second conductor; and
    forming a first bump over the first conductor and a second bump over the second conductor.

19. The method of claim 18, wherein a crack in the semiconductor structure is detected based on the electrical measurement.

20. The method of claim 18, wherein the electrical measurement of the capacitor is performed prior to the formation of the first bump and the second bump.

* * * * *